US010032863B2

(12) United States Patent
Carothers et al.

(10) Patent No.: US 10,032,863 B2
(45) Date of Patent: Jul. 24, 2018

(54) ISOLATED SEMICONDUCTOR LAYER IN BULK WAFER BY LOCALIZED SILICON EPITAXIAL SEED FORMATION (71) Applicant: TEXAS INSTRUMENTS INCORPORATED, Dallas, TX (US)

(72) Inventors: Daniel Nelson Carothers, Lucas, TX (US); Jeffrey R. Debord, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 15/090,000

(22) Filed: Apr. 4, 2016

(65) Prior Publication Data
US 2016/0218177 A1 Jul. 28, 2016

Related U.S. Application Data (63) Continuation of application No. 14/301,788, filed on Jun. 11, 2014, now Pat. No. 9,330,959.
(Continued)

(51) Int. Cl.
*H01L 21/76* (2006.01)
*H01L 29/06* (2006.01)
(Continued)

(52) U.S. Cl.
CPC ...... *H01L 29/0653* (2013.01); *H01L 21/0217* (2013.01); *H01L 21/0223* (2013.01);
(Continued)

(58) Field of Classification Search
CPC ......... H01L 21/02636; H01L 21/02645; H01L 21/02667; H01L 21/02675;
(Continued)

(56) References Cited

U.S. PATENT DOCUMENTS 4,749,441 A * 6/1988 Christenson ...... H01L 21/76264
117/923
4,952,526 A * 8/1990 Pribat ............... H01L 21/76248
117/923
(Continued)

FOREIGN PATENT DOCUMENTS

GB    2494739 A    3/2013

OTHER PUBLICATIONS

International Search Report in corresponding PCT Application No. PCT/US2015/025593, dated Jul. 16, 2015 (2 pages).
European Search Report for EU 15780680.3 dated Oct. 19, 2017.

Primary Examiner — Michael Trinh
(74) Attorney, Agent, or Firm — Michael A. Davis, Jr.; Charles A. Brill; Frank D. Cimino (57) ABSTRACT An integrated circuit may be formed by forming a buried isolation layer in an isolation recess in a single-crystal silicon-based substrate. Exposed lateral surfaces of the substrate at the buried isolation layer are covered with a dielectric sidewall. A seed trench is formed through the buried isolation layer to expose the substrate. A single-crystal silicon-based seed layer is formed through the seed trench, extending above the top surface of the buried isolation layer. A silicon-based non-crystalline layer is formed contacting the seed layer. A cap layer is formed over the non-crystalline layer. A radiant-induced recrystallization process converts the non-crystalline layer to a single-crystal layer aligned with the seed layer. The cap layer is removed and the single-crystal layer is planarized, leaving an isolated semiconductor layer over the buried isolation layer.

15 Claims, 13 Drawing Sheets

Related U.S. Application Data (60) Provisional application No. 61/978,935, filed on Apr. 13, 2014.

(51) Int. Cl.
| | | |
|---|---|---|
| *H01L 21/762* | (2006.01) | |
| *H01L 29/04* | (2006.01) | |
| *H01L 21/84* | (2006.01) | |
| *H01L 27/12* | (2006.01) | |
| *H01L 21/02* | (2006.01) | |
| *H01L 21/3105* | (2006.01) | |
| *H01L 21/3065* | (2006.01) | |
| *H01L 21/306* | (2006.01) | |
| *H01L 29/78* | (2006.01) | |

(52) U.S. Cl.
CPC .. *H01L 21/02164* (2013.01); *H01L 21/02636* (2013.01); *H01L 21/02645* (2013.01); *H01L 21/02667* (2013.01); *H01L 21/02675* (2013.01); *H01L 21/02686* (2013.01); *H01L 21/3065* (2013.01); *H01L 21/30625* (2013.01); *H01L 21/31055* (2013.01); *H01L 21/76224* (2013.01); *H01L 21/76248* (2013.01); *H01L 21/76278* (2013.01); *H01L 21/76283* (2013.01); *H01L 21/84* (2013.01); *H01L 27/12* (2013.01); *H01L 27/1203* (2013.01); *H01L 29/04* (2013.01); *H01L 29/0649* (2013.01); *H01L 29/7851* (2013.01); *H01L 21/0262* (2013.01); *H01L 21/02255* (2013.01); *H01L 21/02532* (2013.01)

(58) Field of Classification Search
CPC ......... H01L 21/76224; H01L 21/76248; H01L 21/76278; H01L 21/76283; H01L 29/04; H01L 27/1203

See application file for complete search history.

(56) References Cited

U.S. PATENT DOCUMENTS

| | | | | |
|---|---|---|---|---|
| 5,891,763 | A * | 4/1999 | Wanlass | H01L 21/28202 257/E21.431 |
| 6,403,427 | B2 * | 6/2002 | Blanchard | H01L 21/76262 257/E21.426 |
| 6,660,582 | B2 * | 12/2003 | Birner | H01L 27/10867 257/E21.652 |
| 7,001,804 | B2 * | 2/2006 | Dietz | H01L 21/76264 257/E21.564 |
| 7,495,287 | B2 * | 2/2009 | Oka | H01L 21/84 257/347 |
| 7,611,937 | B2 | 11/2009 | Lin | |
| 8,993,420 | B2 | 3/2015 | Shin | |
| 2005/0236687 | A1 | 10/2005 | Chan et al. | |
| 2008/0220586 | A1 | 9/2008 | Cheng et al. | |
| 2008/0274594 | A1 | 11/2008 | Karve et al. | |
| 2008/0274595 | A1 | 11/2008 | Spencer et al. | |
| 2010/0200907 | A1 | 8/2010 | Yoo et al. | |
| 2010/0276735 | A1 | 11/2010 | Spencer et al. | |
| 2011/0210389 | A1 | 9/2011 | Griebenow et al. | |
| 2012/0223420 | A1 * | 9/2012 | Schulze | H01L 21/0237 257/647 |
| 2013/0029449 | A1 | 1/2013 | Cheng | |
| 2013/0256758 | A1 | 10/2013 | Camillo-Castillo et al. | |
| 2013/0277854 | A1 | 10/2013 | Wong et al. | |

\* cited by examiner

ISOLATED SEMICONDUCTOR LAYER IN BULK WAFER BY LOCALIZED SILICON EPITAXIAL SEED FORMATION

CROSS-REFERENCE TO RELATED APPLICATIONS

This application claims priority to U.S. application Ser. No. 14/301,788, filed Jun. 11, 2014, now U.S. Pat. No. 9,330,959, which application claims the benefit of and priority to U.S. Provisional Application No. 61/978,935, filed Apr. 13, 2014, both of which are hereby incorporated by reference in their entirety.

FIELD OF THE INVENTION

This invention relates to the field of integrated circuits. More particularly, this invention relates to isolated semiconductor layers in integrated circuits.

BACKGROUND OF THE INVENTION

An integrated circuit with some circuits or components in dielectrically isolated silicon may be formed on a silicon-on-insulator (SOI) wafer. SOI wafers are more expensive than bulk and epitaxial wafers, undesirably increasing the cost of the integrated circuit. Alternately, the circuits or components may be formed over buried layers of silicon dioxide; methods to form the buried silicon dioxide layers such as implanting oxygen have been problematic with respect to providing desired lateral and vertical dimension control of the buried oxide layer, and undesirably increase stress on the wafer, leading to problems during photolithographic operations. Forming thin layers of device quality silicon over buried oxide layers has also been problematic.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

An integrated circuit may be formed by forming an isolation recess in a single-crystal silicon-based substrate and filling the isolation recess with isolation dielectric material to form a buried isolation layer with a top surface lower than a top surface of the adjacent substrate. Exposed lateral surfaces of the substrate at the buried isolation layer are covered with a dielectric sidewall. A seed trench is formed through the buried isolation layer to expose the substrate. A single-crystal silicon-based seed layer is formed through the seed trench, extending above the top surface of the buried isolation layer. A silicon-based non-crystalline layer is formed over the substrate and buried isolation layer, contacting the seed layer. A cap layer is formed over the non-crystalline layer. A radiant-induced recrystallization process heats the non-crystalline layer over the buried isolation layer and converts it to a single-crystal layer aligned with the seed layer. The cap layer is removed and the non-crystalline layer is removed from over the substrate, leaving an isolated semiconductor layer over the buried isolation layer.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

The following co-pending patent applications are related and hereby incorporated by reference in their entirety: U.S. patent application Ser. No. 14/301,765, now U.S. Pat. No. 9,466,520 (filed simultaneously with this application); U.S. patent application Ser. No. 14/301,827, now U.S. Pat. No. 9,312,164 (filed simultaneously with this application); and U.S. patent application Ser. No. 14/301,848, now U.S. Pat. No. 9,472,571 (filed simultaneously with this application). With their mention in this section, these patent applications are not admitted to be prior art with respect to the present invention.

An integrated circuit may be formed by forming an isolation recess in a single-crystal silicon-based substrate and filling the isolation recess with isolation dielectric material to form a buried isolation layer with a top surface lower than a top surface of the adjacent substrate. Exposed lateral surfaces of the substrate at the buried isolation layer are covered with a dielectric sidewall. A seed trench is formed through the buried isolation layer to expose the substrate. A single-crystal silicon-based seed layer is formed through the seed trench, extending above the top surface of the buried isolation layer. A silicon-based non-crystalline layer is formed over the substrate and buried isolation layer, contacting the seed layer. A cap layer is formed over the non-crystalline layer. A radiant-induced recrystallization process heats the non-crystalline layer over the buried isolation layer and converts it to a single-crystal layer aligned with the seed layer. The cap layer is removed and the non-crystalline layer is removed from over the substrate, leaving an isolated semiconductor layer over the buried isolation layer.

Figure 1A:
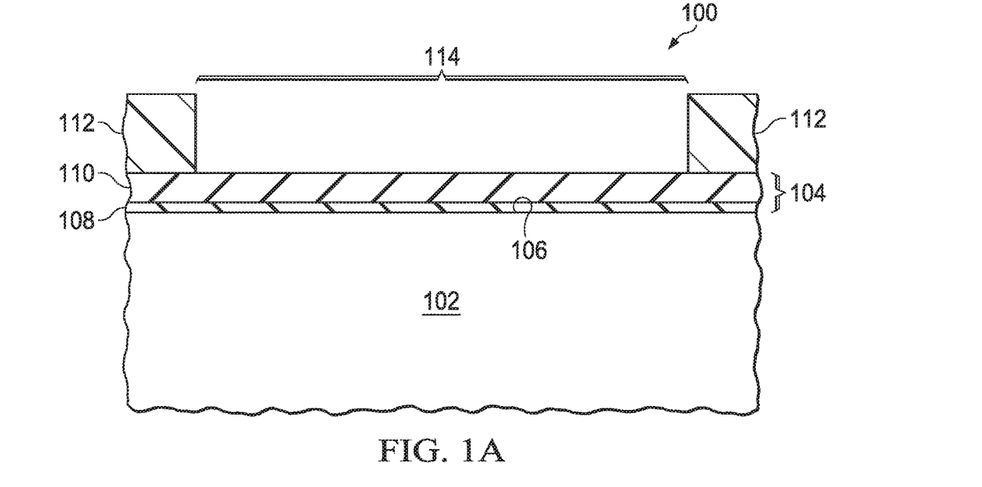
FIG. 1A through FIG. 1S are cross sections of an example integrated circuit, depicted in successive stages of fabrication.
Figure 1B:
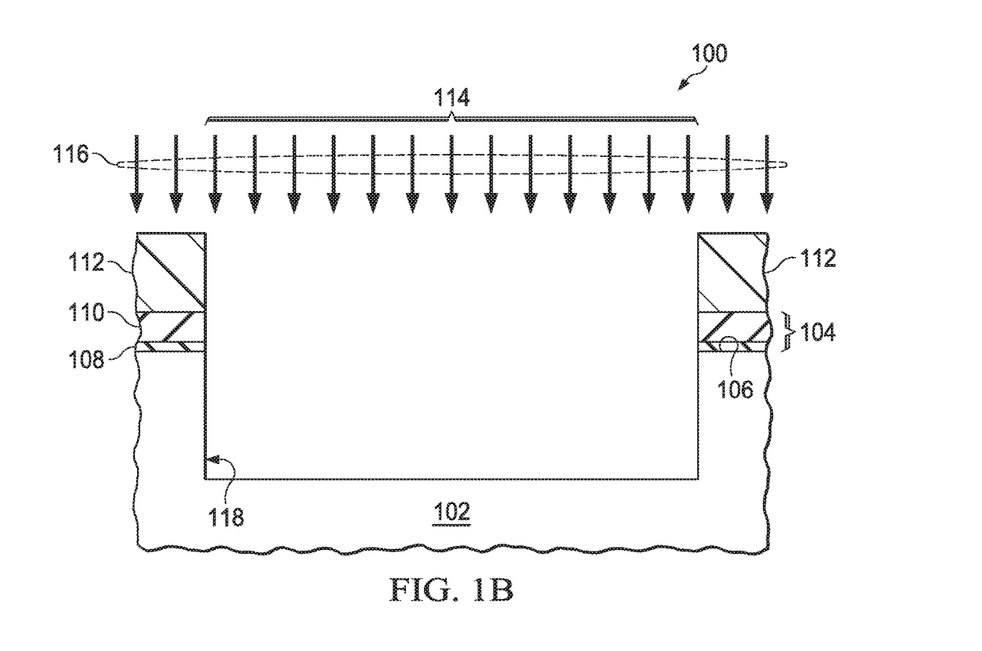
Figure 1C:
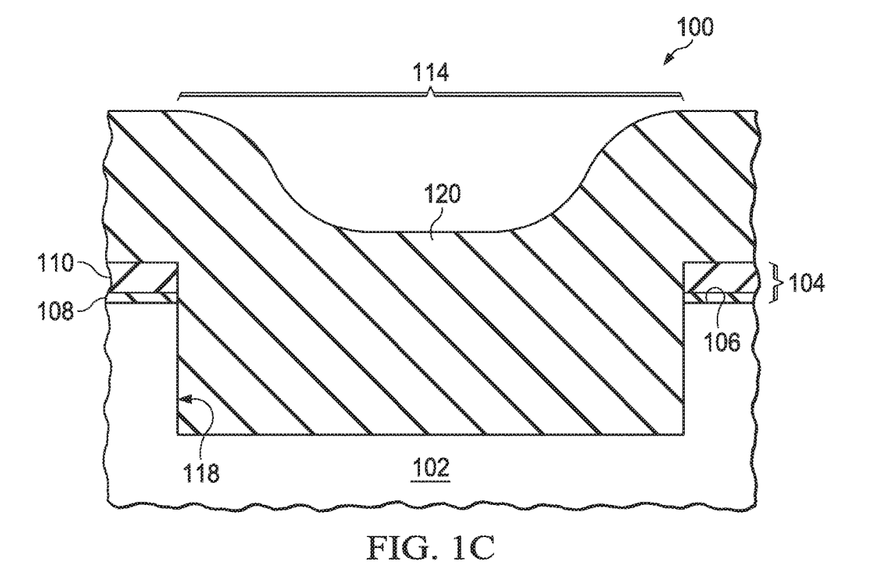
Figure 1D:
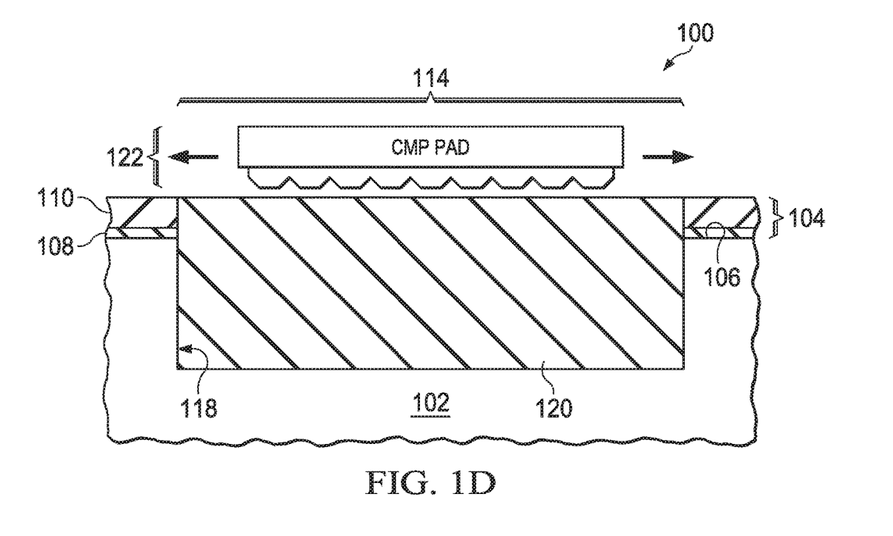
Figure 1E:
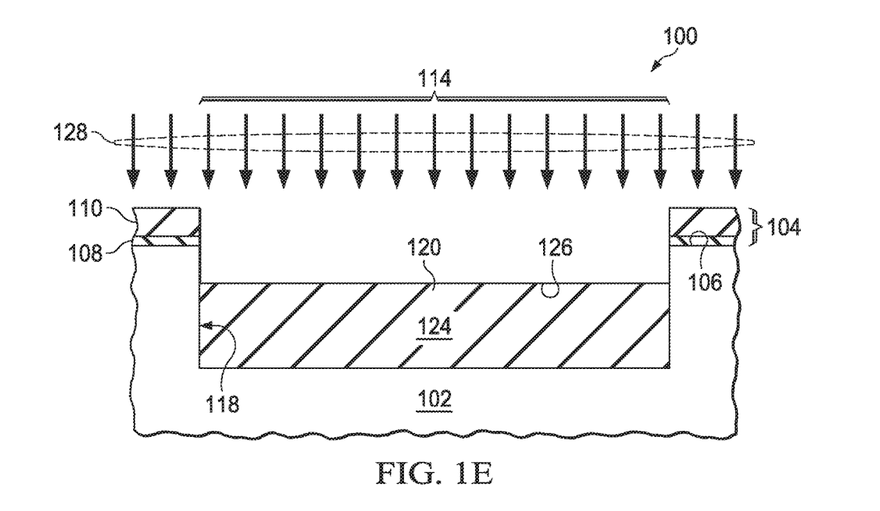
Figure 1F:
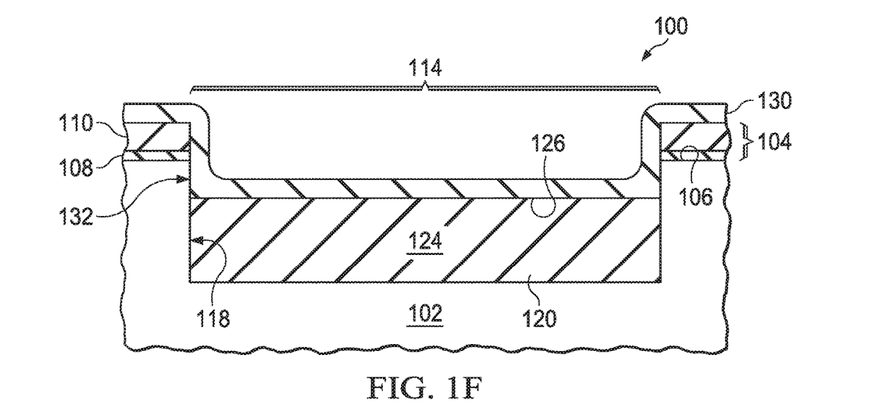
Figure 1G:
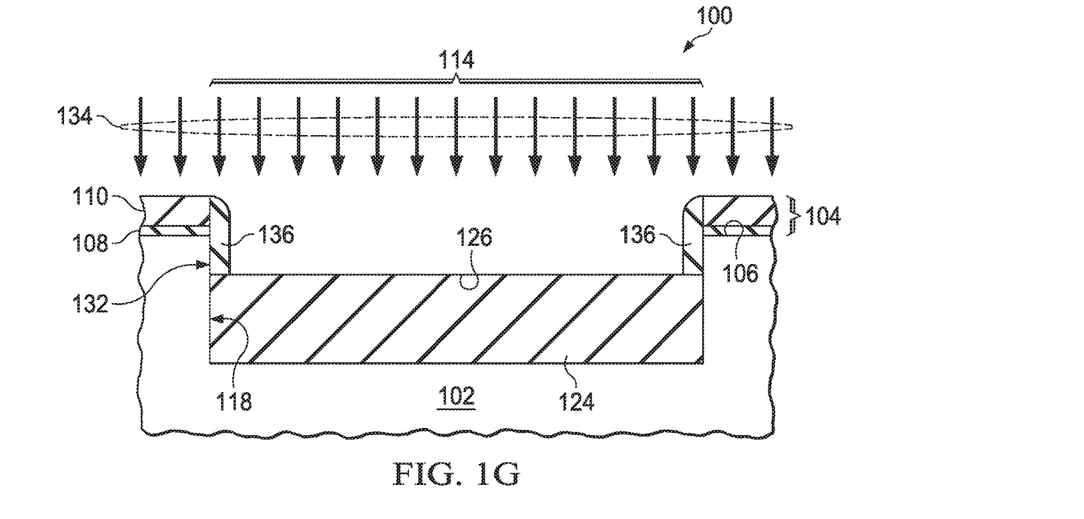
Figure 1H:
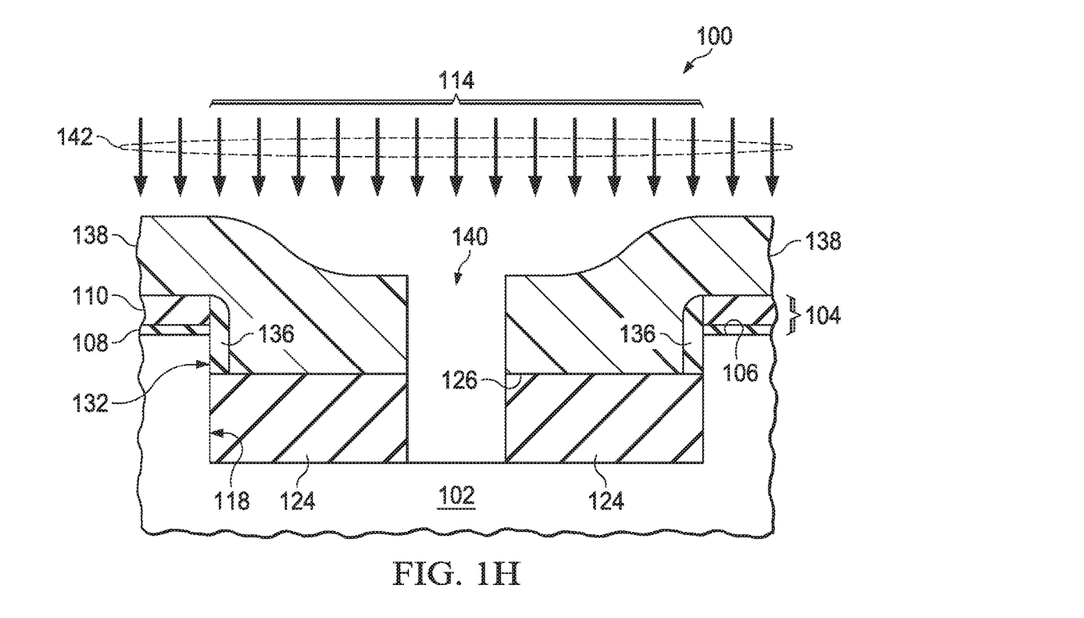
Figure 1I:
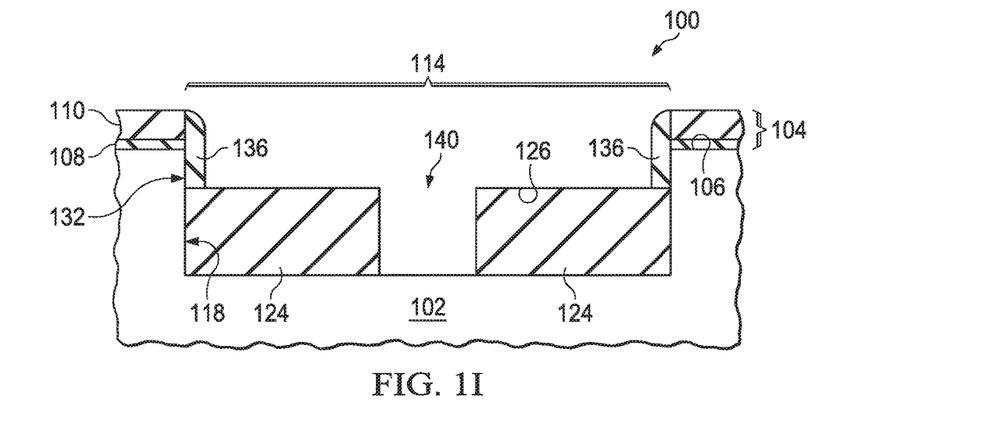
Figure 1J:
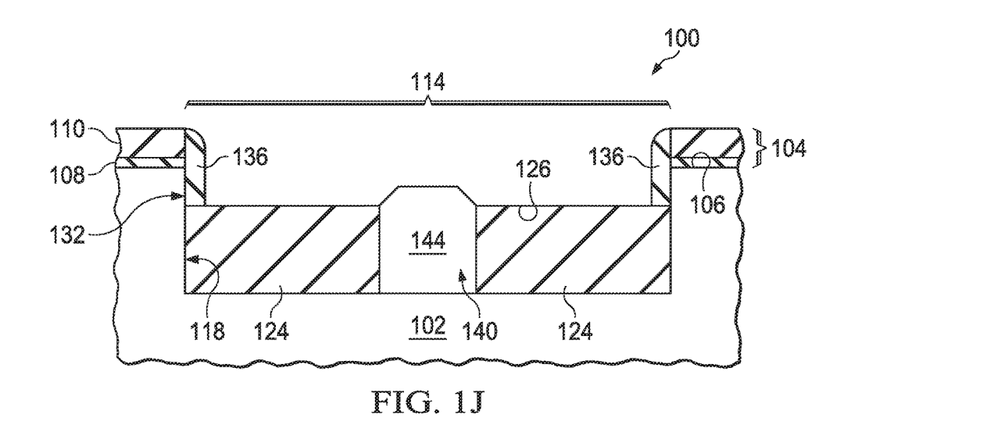
Figure 1K:
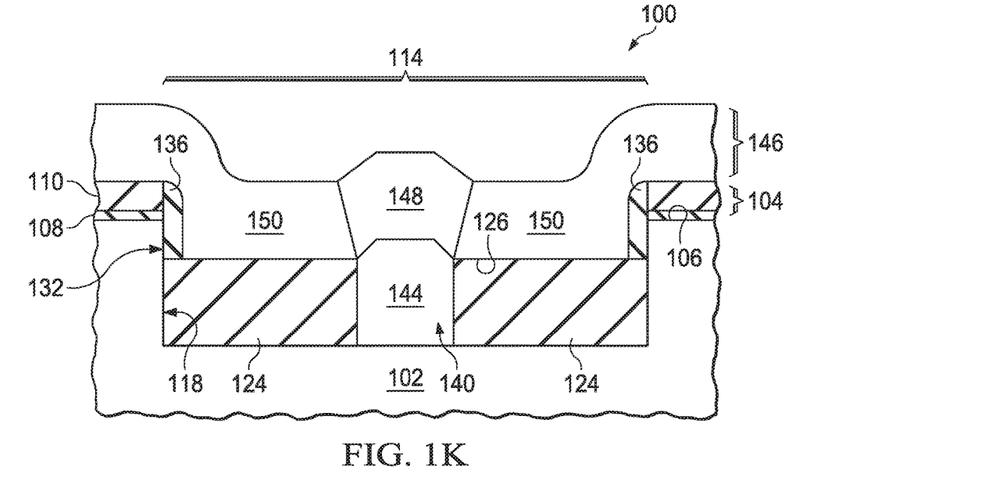
Figure 1L:
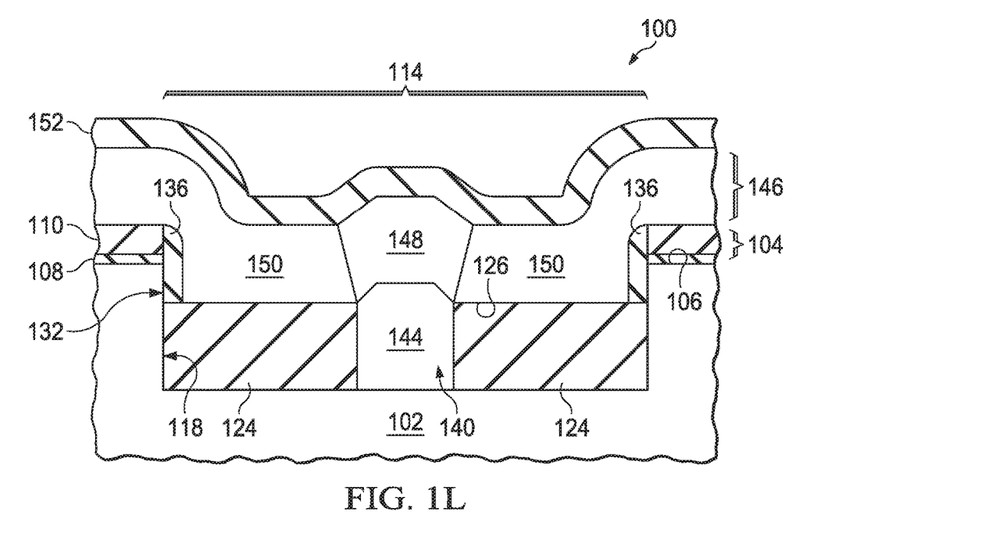
Figure 1M:
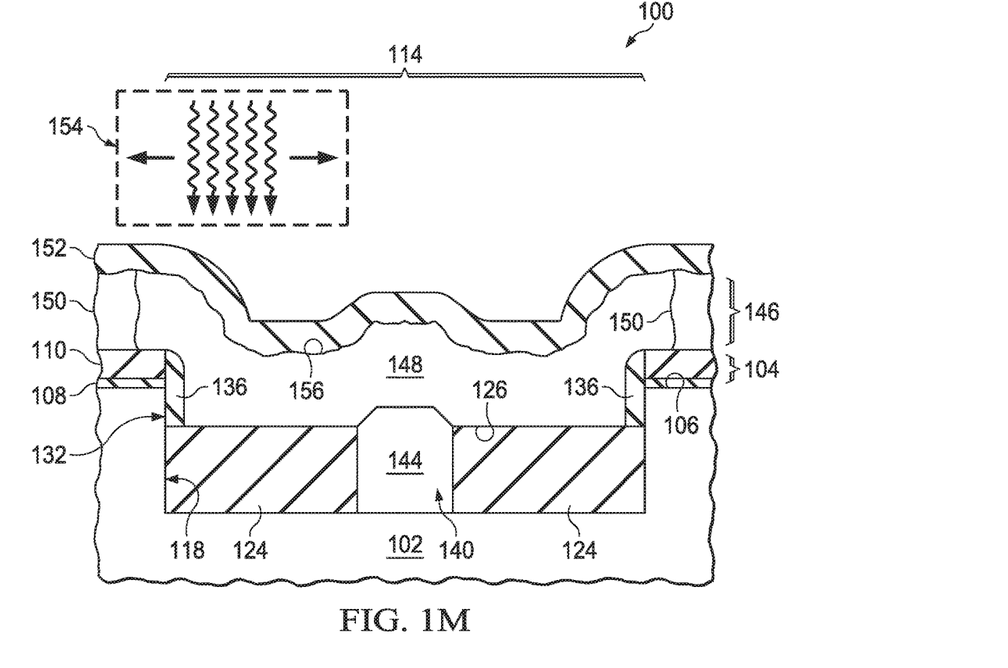
Figure 1N:
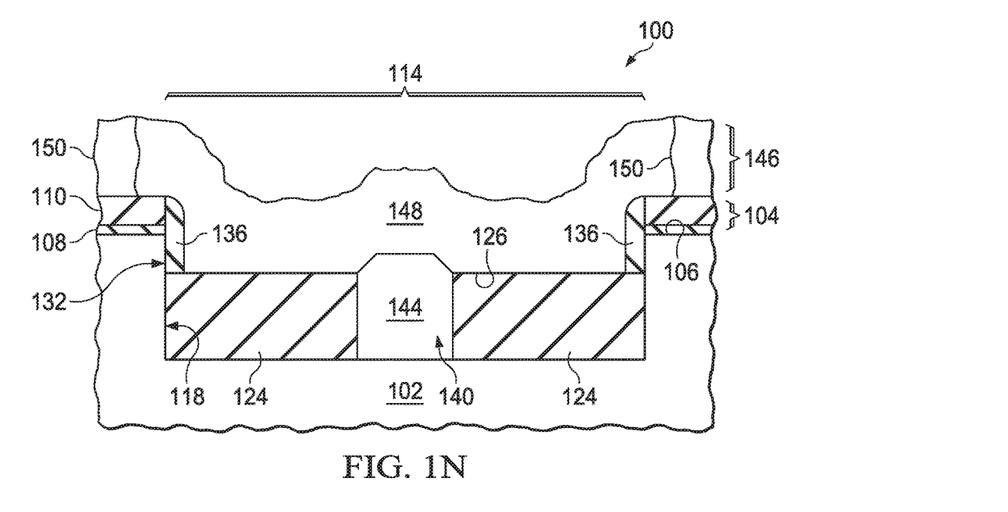
Figure 1O:
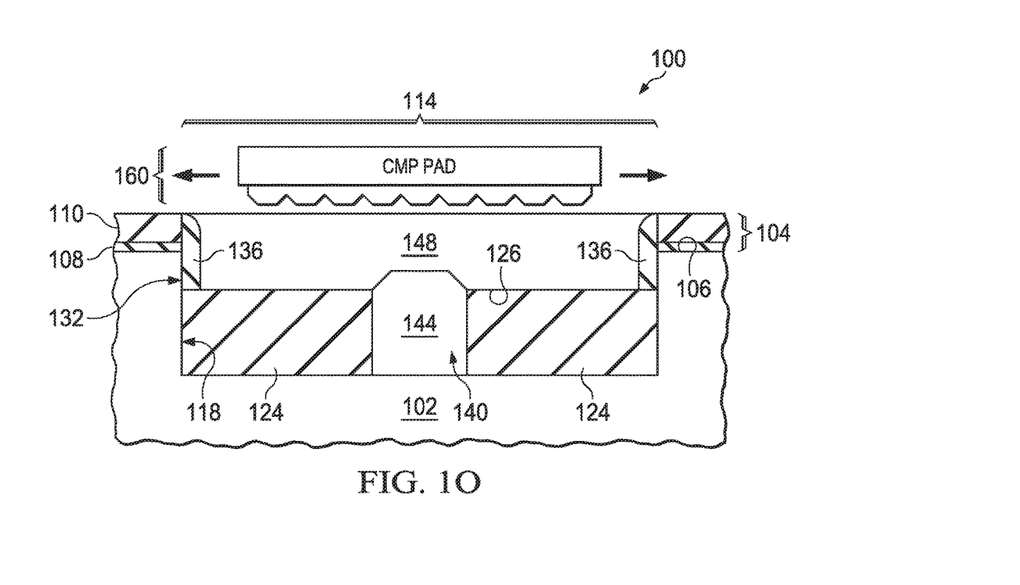
Figure 1P:
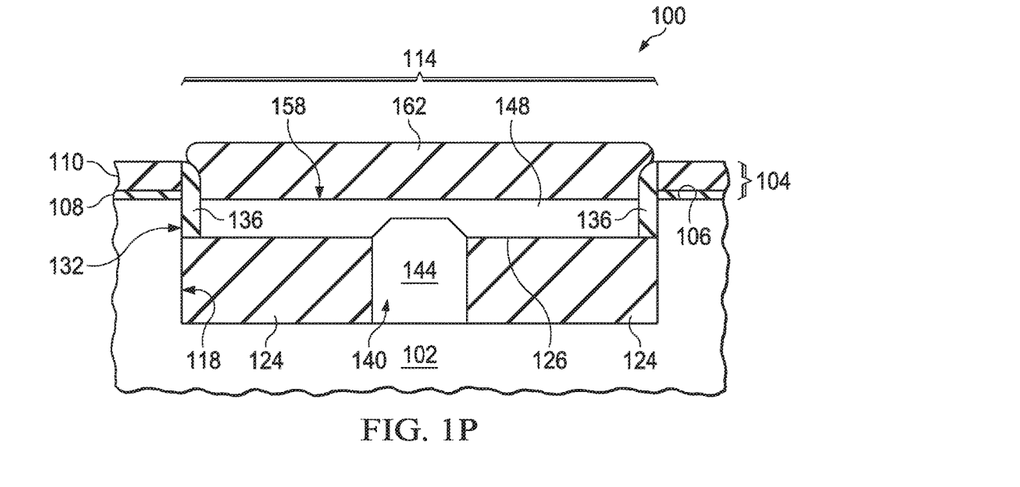
Figure 1Q:
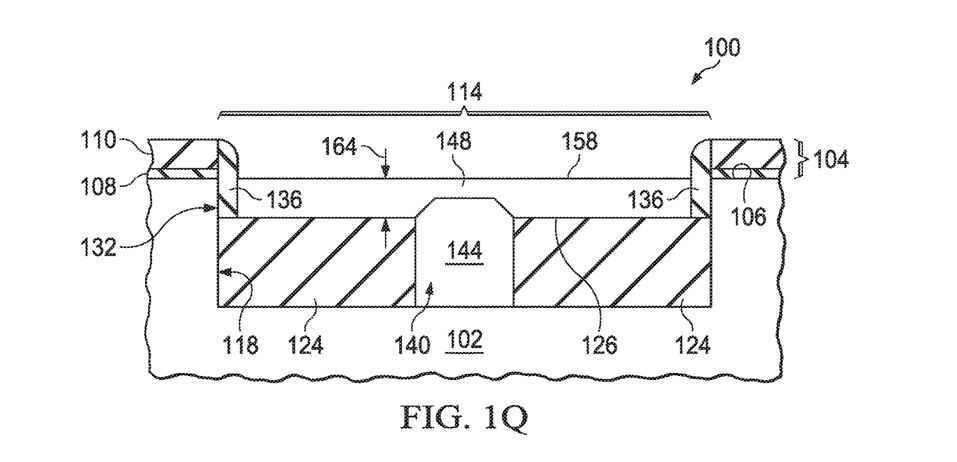
Figure 1R:
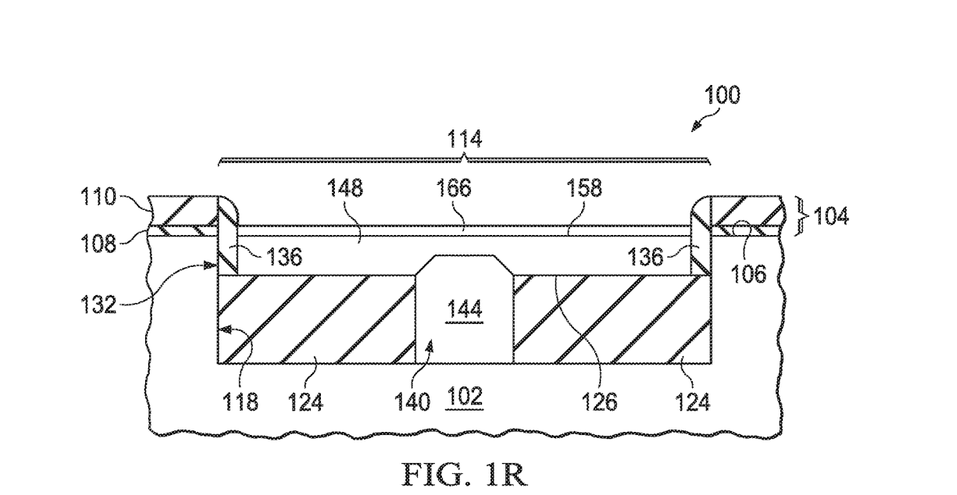
Figure 1S:
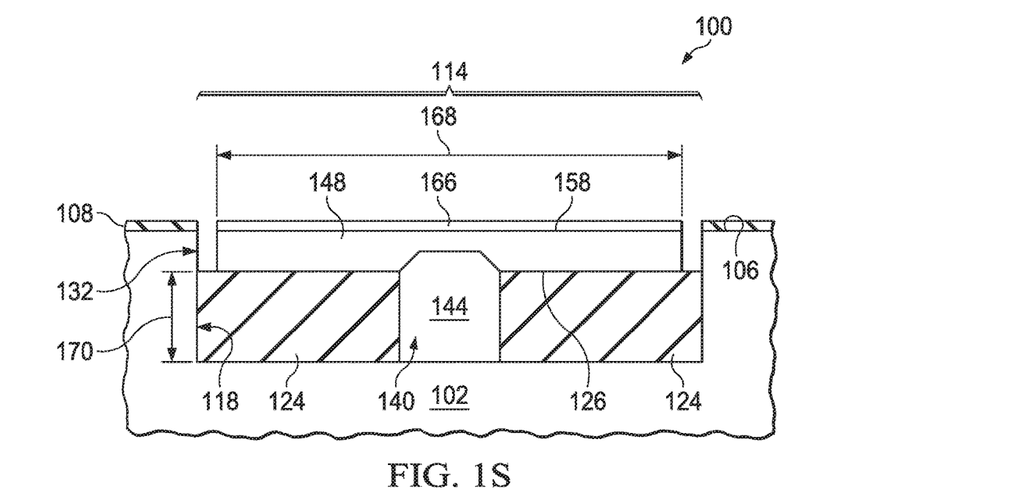

FIG. 1A through FIG. 1S are cross sections of an example integrated circuit, depicted in successive stages of fabrication. Referring to FIG. 1A, the integrated circuit 100 is formed on a substrate 102 of a silicon-based single-crystal semiconductor material. The substrate 102 may be a bulk silicon wafer or a silicon wafer with an epitaxial layer, or other substrate 102 suitable for formation of the integrated circuit 100. A blocking layer 104 is formed over a top surface 106 of the substrate 102 to provide an etch mask for a subsequent trench etch and to block epitaxial growth in a subsequent epitaxy process. The blocking layer 104 may include a layer of silicon dioxide 108 5 nanometers to 20 nanometers thick, formed by thermal oxidation at the top surface 106, and a layer of silicon nitride 110 50 nanometers to 150 nanometers thick formed by a low pressure chemical vapor deposition (LPCVD) process on the layer of silicon dioxide 108. Other structures and compositions of the blocking layer 104 are within the scope of the instant example. An isolation mask 112 is formed over the blocking layer 104 so as to expose an area for an isolated semiconductor layer 114 and cover the adjacent blocking layer 104. The area for the isolated semiconductor layer 114 may be, for example, 2 microns to 200 microns wide. The isolation mask 112 may include photoresist formed by a photolithographic process, and may include an anti-reflection layer and or hard mask material such as silicon carbide or amorphous carbon. The isolation mask 112 may possibly expose other areas of the integrated circuit 100 for field oxide as part of a shallow trench isolation process.

Referring to FIG. 1B, an isolation etch process 116 removes the blocking layer 104 from the area for the isolated semiconductor layer 114 and then removes semiconductor material from the substrate 102 to form an isolation recess 118. The isolation recess 118 may be, for example, 250 nanometers to 1000 nanometers deep in the substrate 102. The isolation etch process 116 may be a reactive ion etch (RIE) process, as depicted schematically in FIG. 1B. The isolation etch process 116 may be a timed etch to provide a desired depth of the isolation recess 118. The isolation mask 112 is removed; a portion of the isolation mask 112 may be removed during the isolation etch process 116 and a remaining portion may be removed after the isolation etch process 116 is completed, for example by an ash process followed by a wet clean process.

Referring to FIG. 1C, isolation dielectric material 120 is formed over an existing top surface of the integrated circuit 100, extending into and filling the isolation recess 118. The isolation dielectric material 120 may be primarily silicon dioxide, primarily aluminum oxide, or may include a plurality of sublayers of different dielectric materials. Silicon dioxide in the isolation dielectric material 120 may be formed by an atmospheric pressure chemical vapor deposition (APCVD) process using silane and oxygen, a plasma enhanced chemical vapor deposition (PECVD) process using tetraethyl orthosilicate, also known as tetraethoxysilane (TEOS), a high density plasma (HDP) process, and/or an ozone based thermal chemical vapor deposition (CVD) process, also known as a high aspect ratio process (HARP). Aluminum oxide in the isolation dielectric material 120 may be formed by a physical vapor deposition (PVD) process in an oxygen ambient, or a CVD process. The isolation dielectric material 120 may be formed by several iterations of deposition followed by partial etchback, to improve a planarity of a top surface of the isolation dielectric material 120.

Referring to FIG. 1D, the isolation dielectric material 120 is planarized down to the blocking layer 104 by a chemical mechanical polish (CMP) process 122, depicted in FIG. 1D by a CMP Pad. The CMP process 122 may use a cerium oxide slurry which has a higher removal rate of the isolation dielectric material 120 than of the blocking layer 104. The CMP process 122 leaves a desired thickness of the blocking layer 104 to block epitaxial material formation during a subsequent epitaxy process.

Referring to FIG. 1E, the isolation dielectric material 120 in the isolation recess 118 is recessed below the top surface 106 of the adjacent substrate 102 to form a buried isolation layer 124. A top surface 126 of the buried isolation layer may be, for example, 50 nanometers to 150 nanometers below the top surface 106 of the substrate 102. The isolation dielectric material 120 may be recessed using a timed plasma etch process 128 as depicted schematically in FIG. 1E, or by another method.

Referring to FIG. 1F, a layer of sidewall material 130 is conformally formed over the blocking layer 104 and extending onto the buried isolation layer 124, so as to cover exposed lateral surfaces 132 of the substrate 102 in the isolation recess 118 above the top surface 126 of the buried isolation layer 124. The layer of sidewall material 130 may include, for example, silicon nitride formed by a PECVD process using bis (tertiary-butylamino) silane (BTBAS). Alternately, the layer of sidewall material 130 may include silicon dioxide formed by a PECVD process using TEOS. The layer of sidewall material 130 may be, for example, 10 nanometers to 25 nanometers thick on the exposed lateral surfaces 132 of the substrate 102 in the isolation recess 118.

Referring to FIG. 1G, an optional anisotropic etch process 134 removes the layer of sidewall material 130 of FIG. 1F from over the blocking layer 104 and from the top surface 126 of the buried isolation layer 124 to leave sidewalls 136 on the exposed lateral surfaces 132 of the substrate 102 in the isolation recess 118. The anisotropic etch process 134 may be an RIE process, similar to the RIE process used to form gate sidewall spacers in metal oxide semiconductor (MOS) transistor fabrication. Alternatively, the sidewalls 136 may be formed by thermal oxidation od silicon in the substrate 102 at the exposed lateral surfaces 132 of the substrate 102 in the isolation recess 118. Alternately, the layer of sidewall material 130 of FIG. 1F may be left intact, for example in a version of the instant example in which the layer of sidewall material 130 is primarily silicon dioxide.

Referring to FIG. 1H, a trench mask 138 is formed over the blocking layer 104 and the buried isolation layer 124 so as to expose an area for a seed trench 140 through the buried isolation layer 124. The trench mask 138 may include photoresist and/or hard mask material. A trench etch process 142 removes dielectric material from the buried isolation layer 124 in the area exposed by the trench mask 138 to form the seed trench 140. The trench etch process 142 may be an ME process as depicted schematically in FIG. 1H. The seed trench 140 exposes the substrate 102.

Referring to FIG. 1I, the trench mask 138 of FIG. 1H is removed; a portion of the trench mask 138 may be removed during the trench etch process 142 and a remaining portion may be removed after the trench etch process 142 is completed. Photoresist in the trench mask 138 may be removed by an ash process followed by a wet clean process using an aqueous mixture of sulfuric acid and hydrogen peroxide and/or an aqueous mixture of ammonium hydroxide and hydrogen peroxide. Hard mask material in the trench mask 138 may be removed by an ME process that is selective to the blocking layer 104 and the buried isolation layer 124.

Referring to FIG. 1J, a single-crystal silicon-based seed layer 144 is grown on the substrate 102 in the seed trench 140, extending above the top surface 126 of the buried isolation layer 124. The selective epitaxial process may start with an in situ clean process such as the Applied Materials Siconi™ clean process, to remove any native oxide from the surface of the substrate 102 in the seed trench 140. The selective epitaxial process may provide dichlorosilane ($SiH_2Cl_2$) gas at 100 standard cubic centimeters per minute (sccm) to 300 sccm and hydrogen chloride (HCl) gas at 100 sccm to 300 sccm at a pressure of 10 torr to 100 torr with the substrate 102 at a temperature of 700° C. to 900° C., which may provide a growth rate of 5 nanometers per minute to 50 nanometers per minute. The sidewalls 136 prevent epitaxial material from forming on the lateral surfaces 132 of the substrate 102 in the isolation recess 118. The blocking layer 104 prevents epitaxial material from forming on the top surface 106 of the substrate 102 adjacent to the isolation recess 118.

Referring to FIG. 1K, a non-selective epitaxial process forms an epitaxial layer 146 of silicon-based semiconductor material over the blocking layer 104 and the buried isolation layer 124, contacting the seed layer 144. The epitaxial layer 146 includes a single-crystalline region 148 on the seed layer 144 and a non-crystalline region 150 on the buried isolation layer 124 laterally contacting the single-crystalline region 148. The non-crystalline region 150 may be polycrystalline or amorphous. A thickness of the non-crystalline region 150 may be 50 nanometers to 200 nanometers thicker than a desired final thickness of a single-crystalline layer over the buried isolation layer 124. For example, the thickness of the non-crystalline region 150 may be 125 nanometers for a final desired thickness of 75 nanometers for the single-crystalline layer over the buried isolation layer 124. A thickness of the single-crystalline region 148 may be substantially equal to or greater than the thickness of the non-crystalline region 150. The non-selective epitaxial process may provide silane ($SiH_4$) and/or disilane ($Si_2H_6$) at 20 standard cubic centimeters per minute (sccm) to 200 sccm at a pressure of 10 torr to 100 torr and a temperature of 500° C. to 700° C., which may provide a growth rate of 5 nanometers per minute to 50 nanometers per minute. Alternatively, the non-selective epitaxial process may provide trisilane ($Si_3H_8$) at 20 milligrams per minute to 250 milligrams per minute at a pressure of 10 torr to 100 torr and a temperature of 400° C. to 650° C. The epitaxial layer 146 may be grown at a higher rate using trisilane than using silane and disilane at a same temperature, or the epitaxial layer 146 may be grown at a rate equivalent to the silane/disilane rate at a lower temperature. In some versions of the instant example, the gases provided to the top surface of the seed layer 144 by the non-selective epitaxial process during formation of the epitaxial layer 146 may be substantially free of chlorine-containing gas, which may form the single-crystalline region 148 and the non-crystalline region 150 with substantially the same thicknesses. In other versions, the gases provided to the substrate 102 during formation of the epitaxial layer 146 may be include some chlorine-containing gas, which may form the single-crystalline region 148 thicker, for example 20 percent thicker, than the non-crystalline region 150. For example, the non-selective epitaxial process may provide dichlorosilane with hydrogen ($H_2$) at a pressure of 20 torr to 100 torr and a temperature of 1080° C. to 1120° C., which may provide a growth rate of 500 nanometers per minute to 2 microns per minute. Alternatively, the non-selective epitaxial process may provide trichlorosilane ($SiHCl_3$) with hydrogen at a pressure of 500 torr to 760 torr and a temperature of 1115° C. to 1200° C., which may provide a growth rate of 3.5 microns per minute to 4 microns per minute.

Referring to FIG. 1L, a cap layer 152 is formed over the epitaxial layer 146. The cap layer 152 may include one or more layers of silicon dioxide, silicon nitride and/or silicon oxynitride. The cap layer 152 may be 50 nanometers to 200 nanometers thick, and may be formed by a PECVD process using TEOS for silicon dioxide and BTBAS for silicon nitride. The cap layer 152 may have an optical thickness, that is the thickness times an effective index of refraction, which provides an effective anti-reflection layer with respect to the non-crystalline region 150 for a subsequent radiant-induced recrystallization process. For example, the optical thickness of the cap layer 152 may be 20 percent to 30 percent of a primary wavelength of radiant energy of the subsequent radiant-induced recrystallization process to provide an effective anti-reflection layer. For a radiant-induced recrystallization process using a carbon dioxide laser with a wavelength of 10.6 microns, the optical thickness of the cap layer 152 may be 2.12 microns to 3.18 microns to provide an effective anti-reflection layer.

Referring to FIG. 1M, a radiant-induced recrystallization process 154 heats the non-crystalline region 150 to a higher temperature than the single-crystalline region 148 of the epitaxial layer 146 so that the non-crystalline region 150 recrystallizes so as to extend the single-crystalline region 148 over the buried isolation layer 124. FIG. 1M depicts the radiant-induced recrystallization process 154 at completion. The radiant-induced recrystallization process 154 may raise the temperature of the non-crystalline region 150 above its melting point. Forming the cap layer 152 to provide an anti-reflection layer with respect to the non-crystalline region 150 may advantageously couple more radiant energy from the radiant-induced recrystallization process 154 into the non-crystalline region 150 than into the single-crystalline region 148, thereby promoting low defects in the extended single-crystalline region 148. The radiant-induced recrystallization process 154 may produce a roughened interface 156 between the cap layer 152 and the newly recrystallized portion of the single-crystalline region 148 over the buried isolation layer 124. The radiant-induced recrystallization process 154 may include, for example, a scanned laser anneal process 154, as depicted schematically in FIG. 1M. Alternatively, the radiant-induced recrystallization process 154 may be a flash lamp anneal process, or other radiant process which provides energy to the non-crystalline region 150 from a radiant source in any part of the electromagnetic spectrum. Forming the epitaxial layer 146 to have the single-crystalline region 148 above the top surface 126 of the buried isolation layer 124 and laterally abutting the non-crystalline region 150 may enable the newly recrystallized portion of the single-crystalline region 148 over the buried isolation layer 124 to form with fewer defects than an epitaxial layer without a single-crystalline region laterally abutting a non-crystalline region.

Referring to FIG. 1N, the cap layer 152 of FIG. 1M is removed without removing a significant portion of the single-crystalline region 148. The cap layer 152 may be removed by a plasma etch selective to the epitaxial layer 146, or by a wet etch using a dilute buffered aqueous solution of hydrofluoric acid.

Referring to FIG. 1O, the single-crystalline region 148 is planarized to provide a smooth top surface 158 of the single-crystalline region 148 extending over the buried isolation layer 124. The single-crystalline region 148 may be planarized by a CMP process 160, depicted in FIG. 1O by the CMP Pad. Alternatively, the single-crystalline region 148 may be planarized by another method, such as a resist etchback process.

Referring to FIG. 1P, a thermal oxidation process may be used to consume a desired thickness of the single-crystalline region 148 at the top surface 158, forming a layer of thermal oxide 162 on the single-crystalline region 148. Consuming the desired thickness of the single-crystalline region 148 using the thermal oxidation process may advantageously consume a uniform amount of the single-crystalline region 148 across the buried isolation layer 124. Other methods of consuming the desired thickness of the single-crystalline region 148, such as a timed blanket etch process, are within the scope of the instant example.

Referring to FIG. 1Q, the layer of thermal oxide 162 of FIG. 1P on the single-crystalline region 148 is removed, leaving the single-crystalline region 148 having a final thickness 164 over the buried isolation layer 124. The layer of thermal oxide 162 may be removed by a plasma etch process, selective to the single-crystalline region 148 and endpointed at the top surface 158 of the single-crystalline region 148. Alternatively, the layer of thermal oxide 162 may be removed by a timed wet etch process using a buffered diluted aqueous solution of hydrofluoric acid. The single-crystalline region 148 over the buried isolation layer 124 provides the isolated semiconductor layer 114. The final thickness 164 may be less than 120 nanometers, for example 75 nanometers to 100 nanometers.

Referring to FIG. 1R, a protective layer 166 is formed over the isolated semiconductor layer 114. The protective layer 166 may include, for example, 5 nanometers to 15 nanometers of thermal oxide. The protective layer 166 has different etch characteristics than the sidewalls 136 and a top layer of the blocking layer 104, for example the layer of silicon nitride 110.

Referring to FIG. 1S, the sidewalls 136 and the layer of silicon nitride 110 of the blocking layer 104 of FIG. 1R are removed. Silicon nitride in the sidewalls 136 and the layer of silicon nitride 110 may be removed by an aqueous solution of phosphoric acid at 150° C. A width 168 of the isolated semiconductor layer 114 may be, for example, 2 microns to 200 microns. A final thickness 170 of the buried isolation layer 124 may be, for example, 200 nanometers to 900 nanometers thick. Components such as transistors may subsequently be formed in the leaving the isolated semiconductor layer 114 over the buried isolation layer 124, advantageously having a low capacitance to the substrate 102.

Figure 2A:
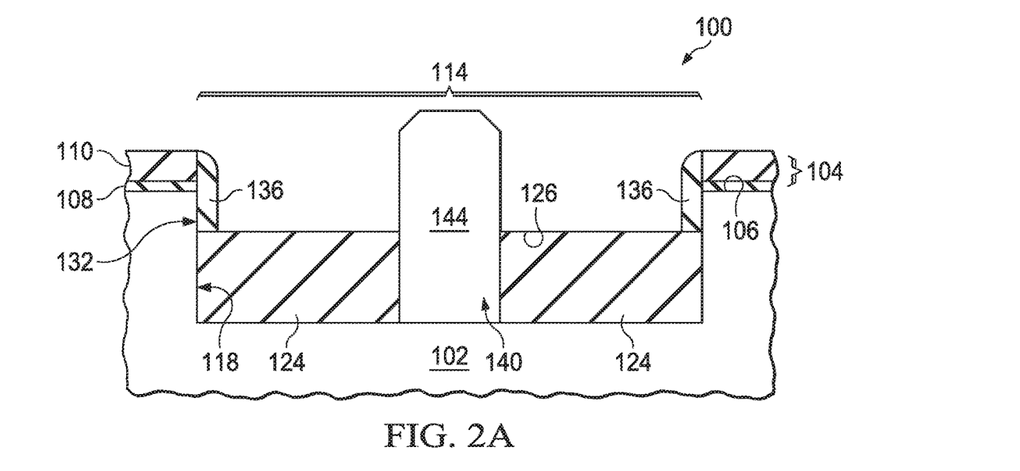
FIG. 2A through FIG. 2G are cross sections of the integrated circuit of FIG. 1A through FIG. 1S, depicting an alternate method for forming the single-crystalline region and the non-crystalline region, and for the subsequent radiant-induced recrystallization process.

FIG. 2A through FIG. 2G are cross sections of the integrated circuit of FIG. 1A through FIG. 1S, depicting an alternate method for forming the single-crystalline region and the non-crystalline region, and for the subsequent radiant-induced recrystallization process. Referring to FIG. 2A, the buried isolation layer 124 is formed in the isolation recess 118 in the substrate 102 of the integrated circuit 100. The top surface 126 of the buried isolation layer 124 is recessed below the top surface 106 of the substrate 102 under the blocking layer 104 adjacent to the isolation recess 118. The sidewalls 136 are formed on the lateral surfaces 132 of the substrate 102 in the isolation recess 118. In the instant example, the seed layer 144 is formed on the substrate 102 in the seed trench 140 so as to extend above a plane defined by the top surface 106 of the substrate 102 adjacent to the isolation recess 118.

Figure 2B:
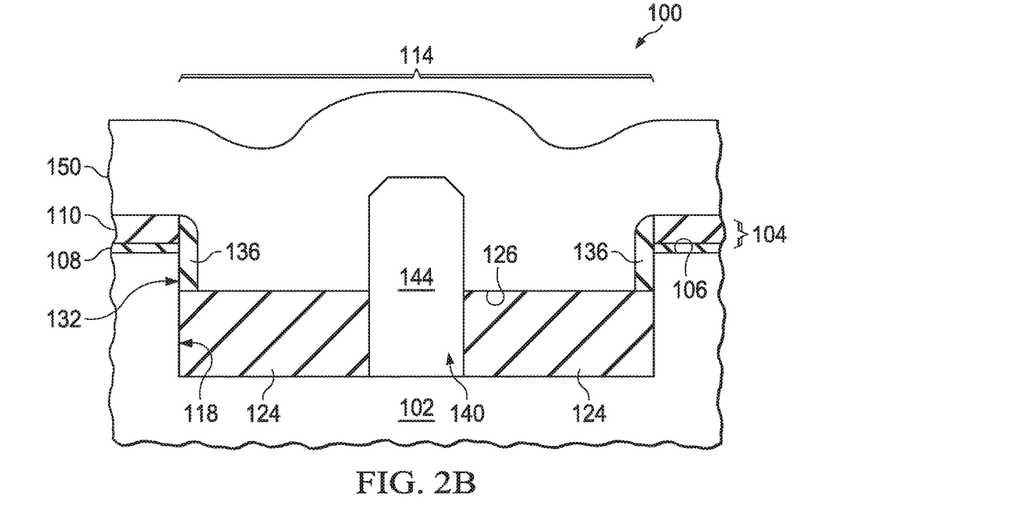

Referring to FIG. 2B, the non-crystalline region 150 is formed over the blocking layer 104 and the buried isolation layer 124 and contacting the seed layer 144. In the instant example, the non-crystalline region 150 is formed as a layer of polycrystalline silicon 150, referred to as polysilicon. The polysilicon non-crystalline region 150 may be formed, for example, by thermal decomposition of silane at a temperature of 550° C. to 600° C. and a pressure of 0.2 torr to 1 torr. Forming the non-crystalline region 150 separately from the seed layer 144 may advantageously provide more thickness control for the non-crystalline region 150 compared to concurrent formation. The sidewalls 136 separate the non-crystalline region 150 from the substrate 102.

Figure 2C:
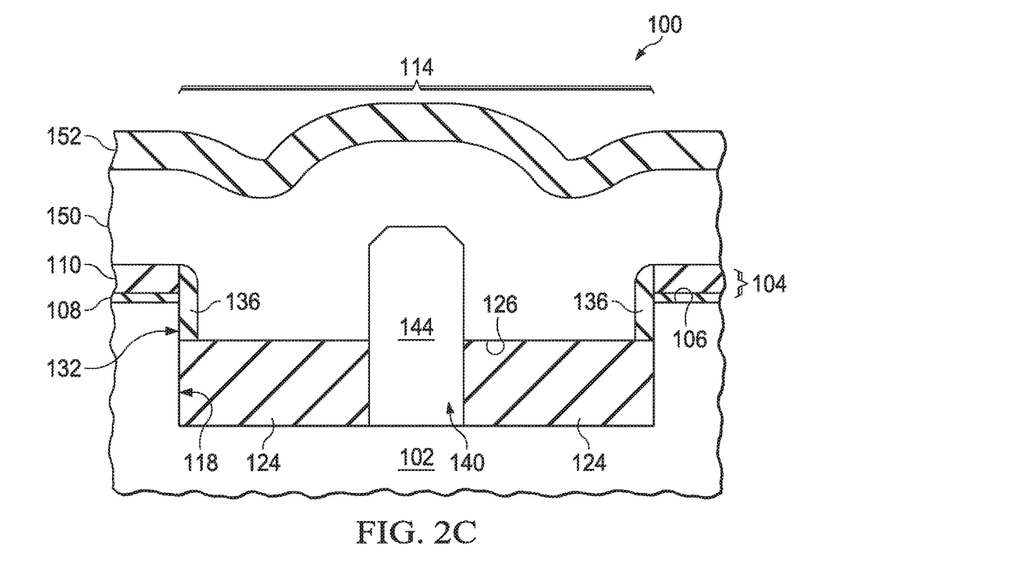

Referring to FIG. 2C, the cap layer 152 is formed over the non-crystalline region 150 as described in reference to FIG. 1L. The cap layer 152 may be formed so as to provide maximum anti-reflection properties for the subsequent radiant-induced recrystallization process in an area proximate to the seed layer 144, taking into account a shape of a top surface of the non-crystalline region 150.

Figure 2D:
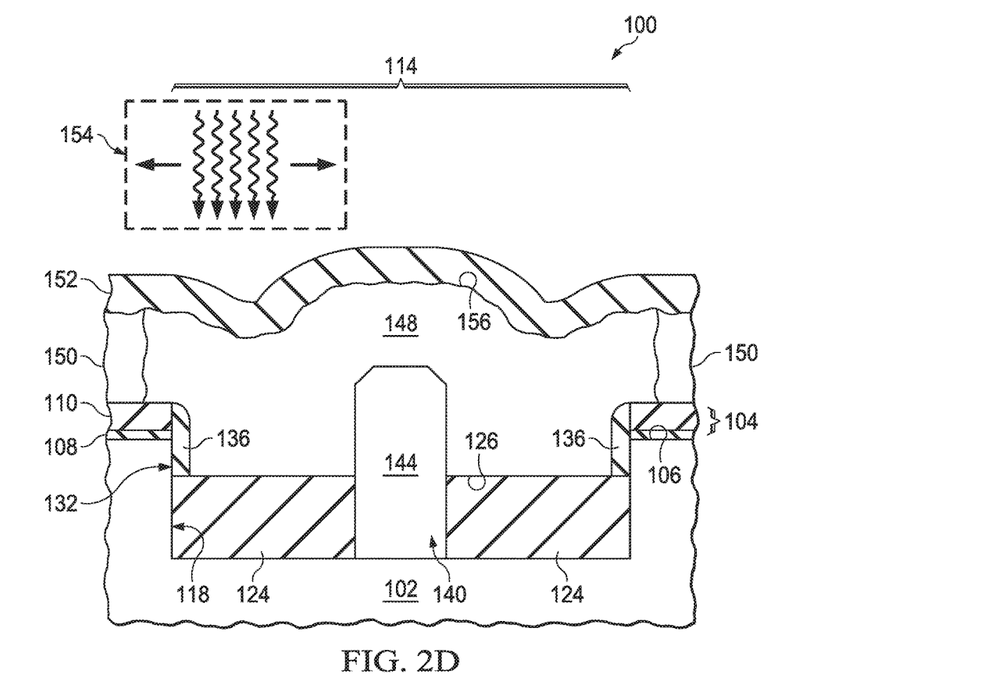

Referring to FIG. 2D, the radiant-induced recrystallization process 154 heats the non-crystalline region 150 to a higher temperature than the seed layer 144 so that polysilicon in the non-crystalline region 150 forms the single-crystalline region 148 around the seed layer 144 and grows outward across the buried isolation layer 124. The radiant-induced recrystallization process 154 may produce a roughened interface 156 between the cap layer 152 and the newly recrystallized portion of the single-crystalline region 148. Forming the seed layer 144 to extend above the top surface 106 of the substrate 102 may enable the newly recrystallized portion of the single-crystalline region 148 over the buried isolation layer 124 to form with fewer defects than with a seed layer 144 coplanar with the top surface 126 of the buried isolation layer 124.

Figure 2E:
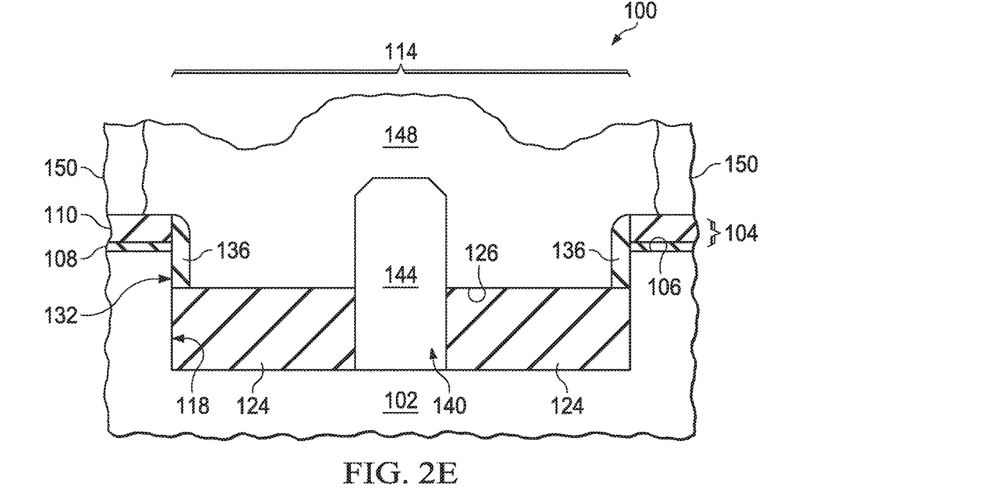

Referring to FIG. 2E, the cap layer 152 of FIG. 2D is removed without removing a significant portion of the single-crystalline region 148. The cap layer 152 may be removed as described in reference to FIG. 1N.

Figure 2F:
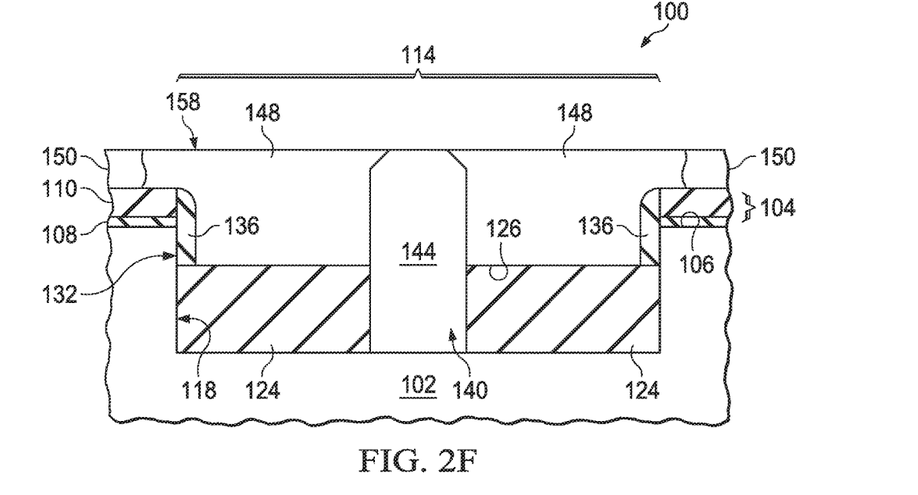

Referring to FIG. 2F, the single-crystalline region 148 and possibly the seed layer 144 are planarized to provide a smooth planar top surface 158. The single-crystalline region 148 and possibly the seed layer 144 may be planarized by a CMP process or by another method. The top surface 158 may be above the blocking layer 104 as depicted in FIG. 2F. In another version of the instant example, the top surface 158 may be substantially coplanar with a top surface of the blocking layer 104, as may result from a CMP planarization process. In a further version, the top surface 158 may be below the top surface of the blocking layer 104 but above the top surface 106 of the substrate 102 adjacent to the isolation recess 118.

Figure 2G:
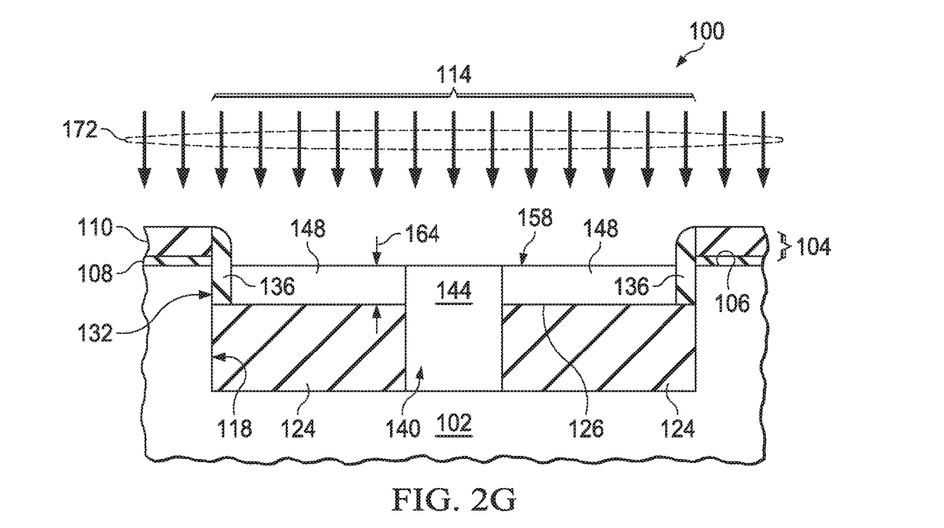

Referring to FIG. 2G, the single-crystalline region 148 is recessed in the isolation recess 118 to provide a desired thickness 164. The single-crystalline region 148 may be recessed by a timed plasma etch process 172 as depicted in FIG. 2G, or possibly by a timed wet etch process using an aqueous buffered solution of hydrofluoric acid. After the desired thickness 164 is attained, process of the integrated circuit 100 continues as described in reference to FIG. 1R et seq.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:
1. An integrated circuit, comprising:
a bulk silicon wafer consisting essentially of silicon single crystal semiconductor material, wherein the bulk sili- con wafer has a recess formed below a top surface of the bulk silicon wafer, the recess having sidewalls and a bottom;

a buried dielectric layer formed at the bottom of the recess, the buried dielectric layer having a trench;

an epitaxial silicon layer at least partly overlying the buried dielectric layer, wherein: to the extent that the epitaxial silicon layer overlies the buried dielectric layer, the epitaxial silicon layer consists essentially of single-crystalline material, at least a portion of the single-crystalline material being formed by radiant-induced recrystallization of non-crystalline material; and a single-crystal silicon-based seed layer completely filling the trench and extending between the bulk silicon wafer and the epitaxial silicon layer.

2. The integrated circuit of claim 1, comprising a dielectric layer over the epitaxial silicon layer.

3. The integrated circuit of claim 1, comprising a dielectric layer between the epitaxial silicon layer and the sidewalls of the recess.

4. The integrated circuit of claim 1, wherein the silicon-based seed layer is formed by selective epitaxial growth.

5. The integrated circuit of claim 4, wherein the silicon-based seed layer is adjacent at least a portion of the single-crystalline material.

6. The integrated circuit of claim 1, wherein a top surface of the epitaxial silicon layer is substantially coplanar with the top surface of the bulk silicon wafer.

7. The integrated circuit of claim 1, wherein the buried dielectric layer comprises silicon dioxide.

8. The integrated circuit of claim 1, wherein the buried dielectric layer comprises a plurality of sublayers of different dielectric materials.

9. The integrated circuit of claim 1, wherein the epitaxial silicon layer is formed by non-selective epitaxial growth.

10. An integrated circuit, comprising:

a bulk silicon wafer consisting essentially of silicon single crystal semiconductor material, wherein the bulk silicon wafer has a recess formed below a top surface of the bulk silicon wafer, the recess having sidewalls and a bottom;

a buried dielectric layer formed at the bottom of the recess, the buried dielectric layer having a trench;

an epitaxial silicon layer formed by non-selective epitaxial growth, and at least partly overlying the buried dielectric layer, wherein: to the extent that the epitaxial silicon layer overlies the buried dielectric layer, the epitaxial silicon layer consists essentially of single-crystalline material, at least a portion of the single-crystalline material being formed by radiant-induced recrystallization of non-crystalline material; and a single-crystal silicon-based seed layer formed by selective epitaxial growth, completely filling the trench, extending between the bulk silicon wafer and the epitaxial silicon layer, and adjacent at least a portion of the single-crystalline material.

11. The integrated circuit of claim 10, comprising a dielectric layer over the epitaxial silicon layer.

12. The integrated circuit of claim 10, comprising a dielectric layer between the epitaxial silicon layer and the sidewalls of the recess.

13. The integrated circuit of claim 10, wherein a top surface of the epitaxial silicon layer is substantially coplanar with the top surface of the bulk silicon wafer.

14. The integrated circuit of claim 10, wherein the buried dielectric layer comprises silicon dioxide.

15. The integrated circuit of claim 10, wherein the buried dielectric layer comprises a plurality of sublayers of different dielectric materials.

* * * * *